United States Patent
Ahdoot

(10) Patent No.: US 10,424,709 B2
(45) Date of Patent: Sep. 24, 2019

(54) APPARATUS FOR THERMOELECTRIC RECOVERY OF ELECTRONIC WASTE HEAT

(71) Applicant: HYPERTECHNOLOGIE CIARA INC., Montreal (CA)

(72) Inventor: Eliot Ahdoot, Dollard des Ormeaux (CA)

(73) Assignee: HYPERTECHNOLOGIE CIARA INC., Montreal (CA)

(*) Notice: Subject to any disclaimer, the term of this patent is extended or adjusted under 35 U.S.C. 154(b) by 0 days.

(21) Appl. No.: 14/961,347

(22) Filed: Dec. 7, 2015

(65) Prior Publication Data

US 2017/0162774 A1    Jun. 8, 2017

Related U.S. Application Data

(63) Continuation-in-part of application No. 14/562,210, filed on Dec. 5, 2014, now abandoned.

(51) Int. Cl.
| | | |
|---|---|---|
| *H01L 35/30* | (2006.01) | |
| *H01L 23/367* | (2006.01) | |
| *H01L 23/473* | (2006.01) | |
| *H01L 35/32* | (2006.01) | |

(52) U.S. Cl.
CPC .......... *H01L 35/30* (2013.01); *H01L 23/3672* (2013.01); *H01L 23/473* (2013.01); *H01L 35/32* (2013.01)

(58) Field of Classification Search
CPC ....... H01L 35/30; H01L 23/473; H01L 35/32; H01L 23/3672
See application file for complete search history.

(56) References Cited

U.S. PATENT DOCUMENTS

| | | | |
|---|---|---|---|
| 4,011,104 A | 3/1977 | Basiulis | |
| 5,419,780 A | 5/1995 | Suski | |
| 5,921,087 A | 7/1999 | Rakesh | |
| 6,226,994 B1 * | 5/2001 | Yamada | F25B 21/02 136/203 |
| 6,371,200 B1 * | 4/2002 | Eaton | C06B 25/02 165/104.33 |

(Continued)

FOREIGN PATENT DOCUMENTS

EP    1670077    10/2004

OTHER PUBLICATIONS

Thermal Conductivity of Materials and Gases from the Engineering Toolbox retrieved on Nov. 3, 2015 from http://www.engineeringtoolbox.com/thermal-conductivity-d_429.html.

*Primary Examiner* — Angelo Trivisonno
(74) *Attorney, Agent, or Firm* — Benoit & Cote, Inc.; C. Marc Benoit

(57) ABSTRACT

The present document describes an apparatus for recovering heat from an electronic component to generate electric energy. The apparatus comprises a thermoelectric generator having a cold side and a hot side, the hot side being in thermal communication with the electronic component. The apparatus further comprises a heat dissipation device in thermal communication with the cold side of the thermoelectric generator for dissipate heat it receives, and a heat transfer device with a thermal conductivity greater than 200 W(m·K) for directly transferring the heat from the electronic component to the heat dissipation device.

16 Claims, 15 Drawing Sheets

(56) References Cited

U.S. PATENT DOCUMENTS

| | | |
|---|---|---|
| 7,081,684 B2 | 7/2006 | Chandrakant |
| 7,939,743 B2 | 5/2011 | Yao Shih |
| 2001/0023591 A1 | 9/2001 | Kazuhiko |
| 2006/0086118 A1* | 4/2006 | Venkatasubramanian .................. F25B 21/02 62/259.2 |
| 2011/0259386 A1* | 10/2011 | Lee ............................ F24J 2/06 136/206 |

* cited by examiner

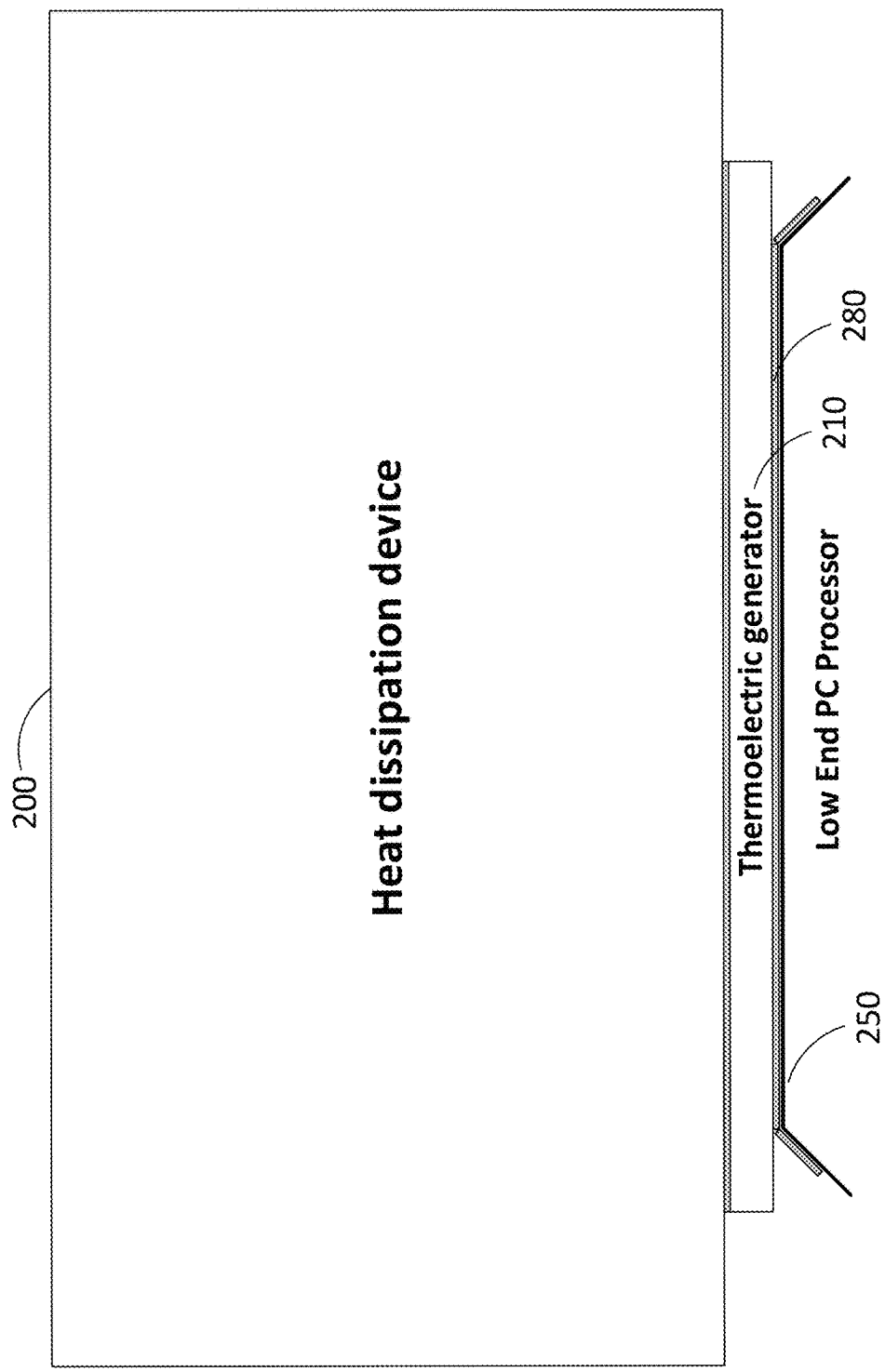

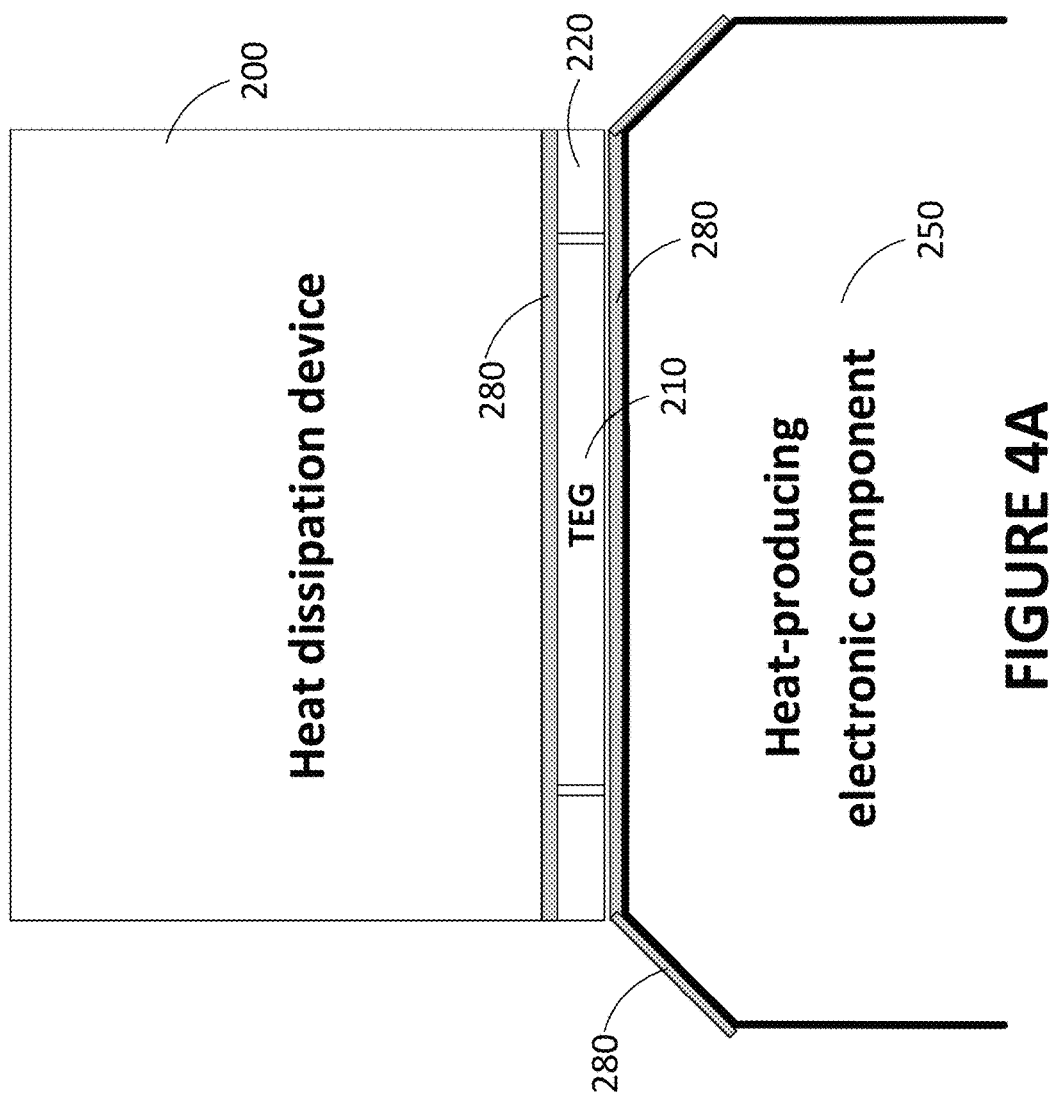

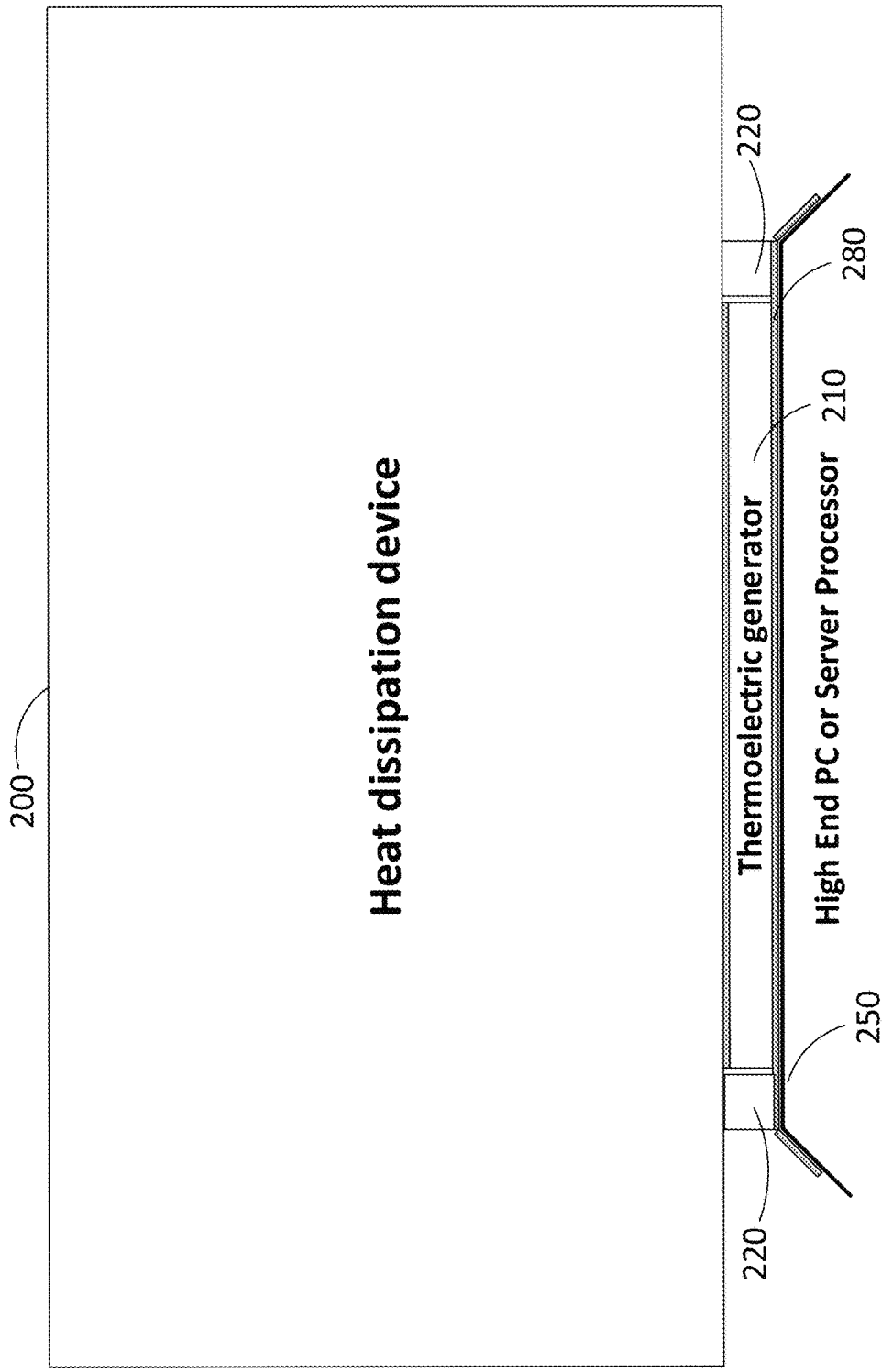

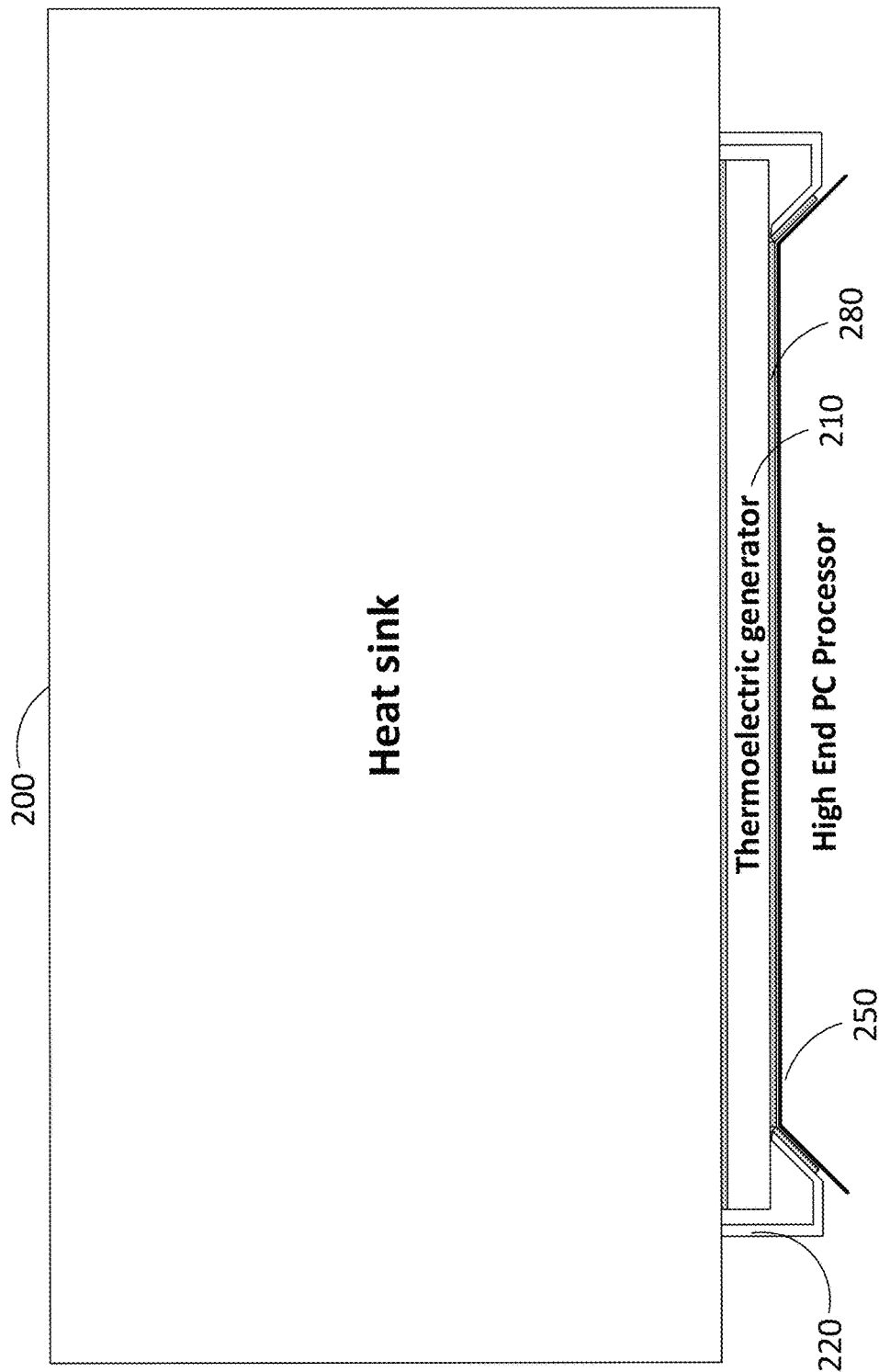

APPARATUS FOR THERMOELECTRIC RECOVERY OF ELECTRONIC WASTE HEAT

CROSS-REFERENCE TO RELATED APPLICATIONS

This application claims priority from U.S. patent application Ser. No. 14/562,210 filed on Dec. 5, 2014.

BACKGROUND (a) Field

The subject matter disclosed generally relates to thermoelectric heat conversion. More specifically, it relates to thermoelectric recovery of heat waste from electronic devices.

(b) Related Prior Art

It is well known that energy consumption should be reduced where possible, because of environmental considerations, resource rarity and increased prices, among others.

A specific example includes the overall energy consumption of electronic devices, which is increasing on a global level. The same applies at a smaller scale: the cost for running a server, such as internet servers or data servers found in a data centers, is mainly based on maintenance and energy consumption. The predominance of the internet and the increasing popularity of cloud solutions push toward finding solutions to reduce the energy consumption of electronic devices such as servers, supercomputers, computers and the like.

One of the possible venues for this consumption reduction lies in the use of the unavoidable heat waste produced by the electronic components of an electronic device.

Despite various attempts to convert waste heat from a variety of heat sources using thermoelectric devices, most of them fail to provide a viable solution. Thermoelectric devices, such as Peltier generators, usually require a high temperature difference to work efficiently. In many heat recovery applications, heat is not sufficiently channeled to the heat generator, resulting in low efficiency.

Applications directed to the conversion of heat waste from electronic devices or electronic components often face a different type of issue. The thermoelectric generator does not dissipate heat fast enough for the electronic component (e.g. CPU, memory, chipset, etc.), which overheats. If the electronic component stops working, the heat recovery apparatus becomes useless.

There is therefore a need for an apparatus and associated method for extracting electrical energy from the waste heat without causing the electronic component to overheat.

Existing system, for example in US2006/0086118A1, fail to provide necessary heat diversion. There is a need for an apparatus in which the necessary heat diversion rate could be provided.

SUMMARY

According to an aspect of the invention, there is provided an apparatus for recovering heat from an electronic component to generate electric energy, the apparatus comprising:
  a thermoelectric generator having a cold side and a hot side, the hot side in thermal communication with the electronic component;
  a heat dissipation device in thermal communication with the cold side of the thermoelectric generator to dissipate heat it receives; and
  a heat transfer device comprising a material with a thermal conductivity greater than 200 W(m·K) for directly transferring the heat from the electronic component to the heat dissipation device.

According to an embodiment, the material of the heat transfer device comprises a metallic material.

According to an embodiment, the metallic material comprises copper.

According to another embodiment, the metallic material comprises aluminum.

According to an embodiment, there is further provided one of thermal paste and thermal adhesive between the electronic component and the thermoelectric generator, and between the electronic component and the heat transfer device, for enabling heat transfer therebetween.

According to an embodiment, the one of thermal paste and thermal adhesive has a thermal conductivity substantially smaller than the thermal conductivity of the material of the heat transfer device, the one of thermal paste and thermal adhesive being substantially thinner than the heat transfer device for maintaining, during use, a heat transfer sufficient to avoid overheating of the electronic component.

According to an embodiment, the heat dissipation device comprises a liquid-cooling heat sink.

According to an embodiment, the heat transfer device comprises a heat pipe.

According to an embodiment, the heat pipe surrounds the thermoelectric generator at least partially.

According to an embodiment, the heat dissipation device comprises a heat transfer fluid for absorbing the heat from the thermoelectric generator and from the heat transfer device.

According to an embodiment, the heat dissipation device further comprises a pipe for having the heat transfer fluid circulate therein, for improving heat transfer to the heat dissipation device.

According to an embodiment, the heat dissipation device further comprises a heat sink in thermal communication with at least one of the pipe and the heat transfer fluid, for releasing heat from the heat transfer fluid.

According to an embodiment, the apparatus is for recovering heat from an electronic component comprising one of: a processor, a physical memory, and a chipset.

According to an embodiment, the hot side in thermal communication with the electronic component comprises a hot side in thermal communication with a heat spreader of the electronic component.

According to an embodiment, the thermoelectric generator is affixed on a part of a surface of the electronic component, defining a remainder of the surface of the electronic component, and wherein the heat transfer device is affixed on the remainder of the surface, thereby surrounding the thermoelectric generator at least partially.

According to an embodiment, the thermoelectric generator and the heat transfer device substantially have the same thickness, and wherein the heat dissipation device is affixed on both the thermoelectric generator and the heat transfer device.

According to another embodiment, the heat transfer device comprises a heat conductor.

According to an embodiment, the heat conductor surrounds the thermoelectric generator at least partially.

According to an embodiment, the heat dissipation device comprises a heat exchange device for completely covering the cold side of the thermoelectric generator and for covering at least partially the heat transfer device.

According to an embodiment, the heat exchange device is in thermal communication with the heat transfer fluid, for transferring heat from the cold side of the thermoelectric generator and from the heat transfer device to the heat transfer liquid.

According to another aspect of the invention, there is provided an apparatus for recovering heat from an electronic component to generate electric energy, the apparatus comprising:
- a thermoelectric generator having a cold side and a hot side, the hot side in thermal communication with the electronic component;
- a heat dissipation device in thermal communication with the cold side of the thermoelectric generator to dissipate heat it receives; and
- a heat transfer device comprising for directly transferring the heat from the electronic component to the heat dissipation device, the heat transfer device comprising one of: copper and aluminum.

According to an embodiment, there is further provided one of thermal paste and thermal adhesive between the electronic component and the thermoelectric generator, and between the electronic component and the heat transfer device, for enabling heat transfer therebetween.

According to an embodiment, the one of thermal paste and thermal adhesive has a thermal conductivity substantially smaller than a thermal conductivity of the heat transfer device, the one of thermal paste and thermal adhesive being substantially thinner than the heat transfer device for maintaining, during use, a heat transfer sufficient to avoid overheating of the electronic component.

According to another aspect of the invention, there is provided a method for recovering heat from an electronic component, the method comprising: transferring, from the electronic component: a first fraction of the heat to a thermoelectric generator for heat recovery; and a second fraction of the heat to the heat transfer device for increasing heat evacuation from the electronic component; and actively cooling down the thermoelectric generator and the heat transfer device.

According to an embodiment, the step of actively cooling down the thermoelectric generator and the heat transfer device comprises liquid-cooling the thermoelectric generator and the heat transfer device.

According to an embodiment, the step of liquid-cooling comprises pumping a liquid from the thermoelectric generator and the heat transfer device at which heat is absorbed by the liquid toward a heat sink at which heat is released.

According to an embodiment, there is further provided the step of, upon transferring a first fraction of the heat to a thermoelectric generator, generating electric energy.

As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which:

FIG. 3A is a schematic diagram illustrating an apparatus, which comprises a heat dissipation device 200, for recovering heat from an electronic component, according to an embodiment;

FIG. 4A is a schematic diagram illustrating an apparatus for recovering heat from an electronic component, in which a portion of the heat is directed away from the thermoelectric generator to a heat dissipation device 200, according to an embodiment;

FIG. 5A is a schematic diagram illustrating an apparatus, which comprises a heat dissipation device 200, for recovering heat from an electronic component, in which a portion of the heat is directed away from the thermoelectric generator to the heat dissipation device 200 via a heat transfer device, according to another embodiment;

FIG. 7A is a schematic diagram illustrating an apparatus, which comprises a heat dissipation device 200, for recovering heat from an electronic component, in which a portion of the heat is directed away from the thermoelectric generator to the heat dissipation device 200 via a heat transfer device, according to an embodiment;

It will be noted that throughout the appended drawings, like features are identified by like reference numerals.

DETAILED DESCRIPTION

In embodiments there are disclosed an apparatus and a method for recovering heat (usually waste heat) from an electronic component, such as a processor, a CPU, a physical memory and other components found in a personal computer (PC), in a server or in any other type of computing device which produces heat in a rate sufficient to become an issue.

Figure 1:
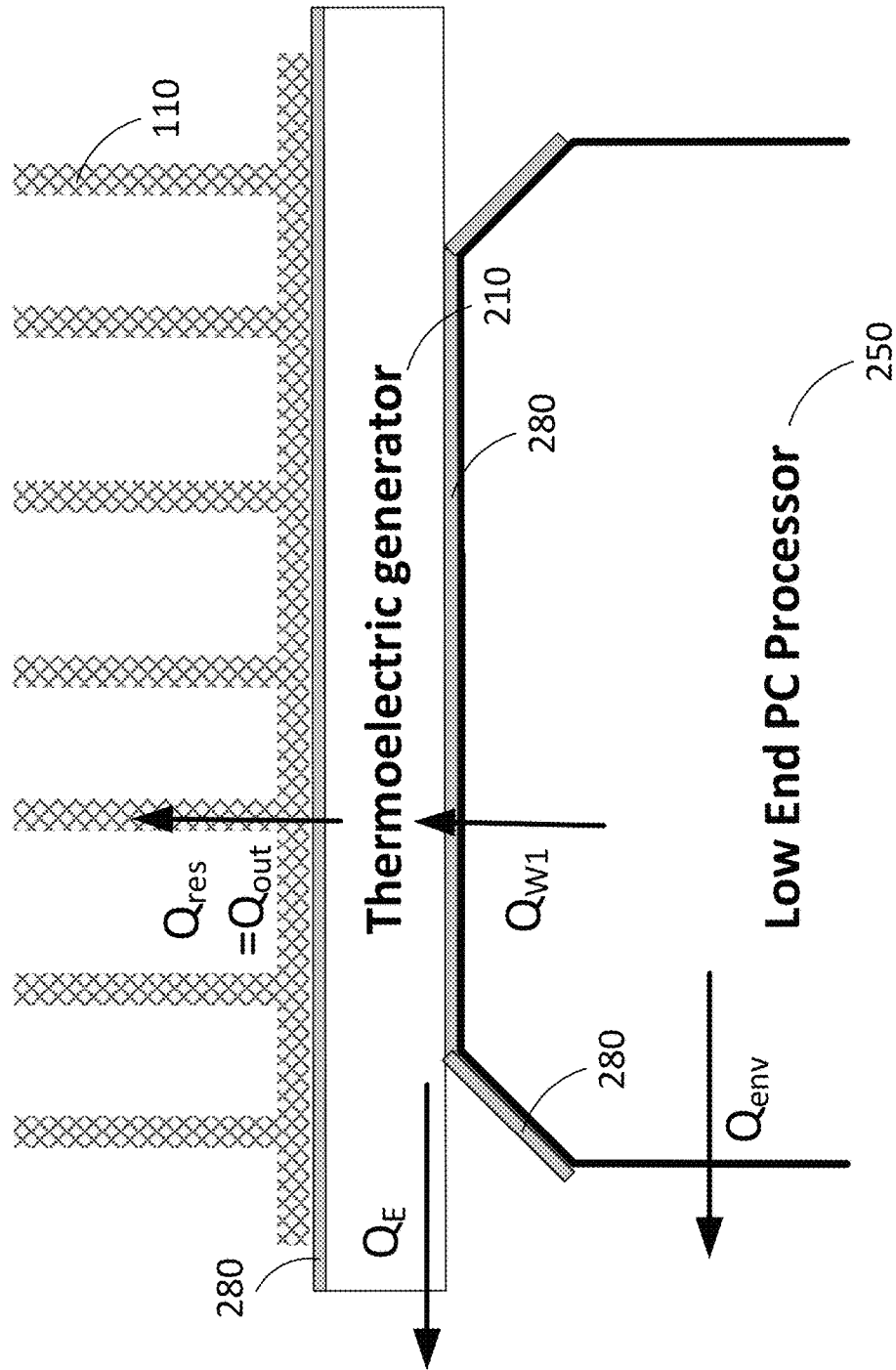
FIG. 1 is a schematic diagram illustrating a prior art apparatus for recovering heat from an electronic component, according to an embodiment, with arrows indicating heat flows.

Referring now to the drawings, and more particularly to FIG. 1, there is shown an embodiment in which there are provided a thermoelectric generator 210 and a radiator or heat sink 110. The waste heat $Q_W$ generated by the electronic component 250 is dissipated in the thermoelectric generator 210 ($Q_{W1}$) and in the environment ($Q_{env}$).

From the heat entering the thermoelectric generator 210 ($Q_{W1}$), a fraction is transformed into electrical energy via the Seebeck effect ($Q_E$). The rest of the heat is residual heat ($Q_{res}$) that reaches the cold side of the thermoelectric generator 210 to be taken away by the heat sink 110 ($Q_{out}=Q_{res}$).

At steady state, the energy balance for these elements can be written as follows (the dot indicates a derivative with respect to time, $\dot{Q}$ is power).

For the electronic component 250: $\dot{Q}_W = \dot{Q}_{W1} + \dot{Q}_{env}$.
For the thermoelectric generator 210: $\dot{Q}_{W1} = \dot{Q}_E + \dot{Q}_{res}$.
For the heat sink 110: $\dot{Q}_{res} = \dot{Q}_{out}$.

When adding all the balance equations for the whole system:

$$\dot{Q}_W = \dot{Q}_E + \dot{Q}_{out} + \dot{Q}_{env}$$

At steady state, temperatures are constant for the electronic component 250 ($T_{EC}$), the hot side of the thermoelectric generator 210 ($T_H$), the cold side of the thermoelectric generator 210 ($T_C$) and the radiator ($T_{Rad}$).

If the thermal communication between all these elements is good, both sides of the thermoelectric generator 210 should have approximately the same temperature as the element to which it is connected: $T_H \approx T_{EC}$ (hot side approximately the same temperature as the electronic component 250) and $T_C \approx T_{Rad}$ (cold side approximately the same temperature as the heat sink 110).

As a reminder, the voltage $\Delta V$ generated by the thermoelectric generator 210 under the Seebeck effect characterized by a Seebeck coefficient $S_{ab}$ is $\Delta V = S_{ab}(T_H - T_C)$. Furthermore, when this voltage is applied to a load resistance R, the electrical power is expressed as:

$$\dot{Q}_E = \frac{(\Delta V)^2}{R} = \frac{S_{ab}^2}{R}(T_H - T_C)^2.$$

Since the goal of the thermoelectric generator 210 is to maximize the outputted electrical power $\dot{Q}_E$, most of the prior art aims at keeping a high temperature difference, thereby resulting in keeping a high temperature at the hot side ($T_H$).

However, when the electronic component 250 is particularly powerful (e.g. high-end PC processors, server processors, etc.), the waste heat that is generated, $\dot{Q}_W$, is very high. Since the dissipation to the environment is limited by the low conductivity of air and relative absence of convection in the device, $\dot{Q}_{env}$ is very small. For high temperatures, the thermoelectric generator 210 has a good efficiency and keeps the residual heat $\dot{Q}_{res} = \dot{Q}_{out}$ low as well. Therefore, the outputted electrical power $\dot{Q}_E$ must be relied upon to ensure the evacuation of waste heat generated within the electronic component 250. However, for low temperature differences (i.e. low $T_H$ at the hot side of the thermoelectric generator 210), $\dot{Q}_E$ is small, thereby resulting in a temperature rise at the hot side and in the electronic component 250.

Given the high value of $\dot{Q}_W$ in powerful electronic devices, the temperature: $T_H \approx T_{EC}$ must rise at a very high value in order to reach a steady state in which $\dot{Q}_W = \dot{Q}_E + \dot{Q}_{out} + \dot{Q}_{env}$. For electronic components such as the CPU of a data server, for example, the high temperature of the electronic component $T_{EC}$ is so high that the electronic component 250 overheats and does not work anymore. Even though electric power can be outputted from the thermoelectric generator 210, the whole system becomes useless because it renders the heating source dysfunctional.

Figure 3B:
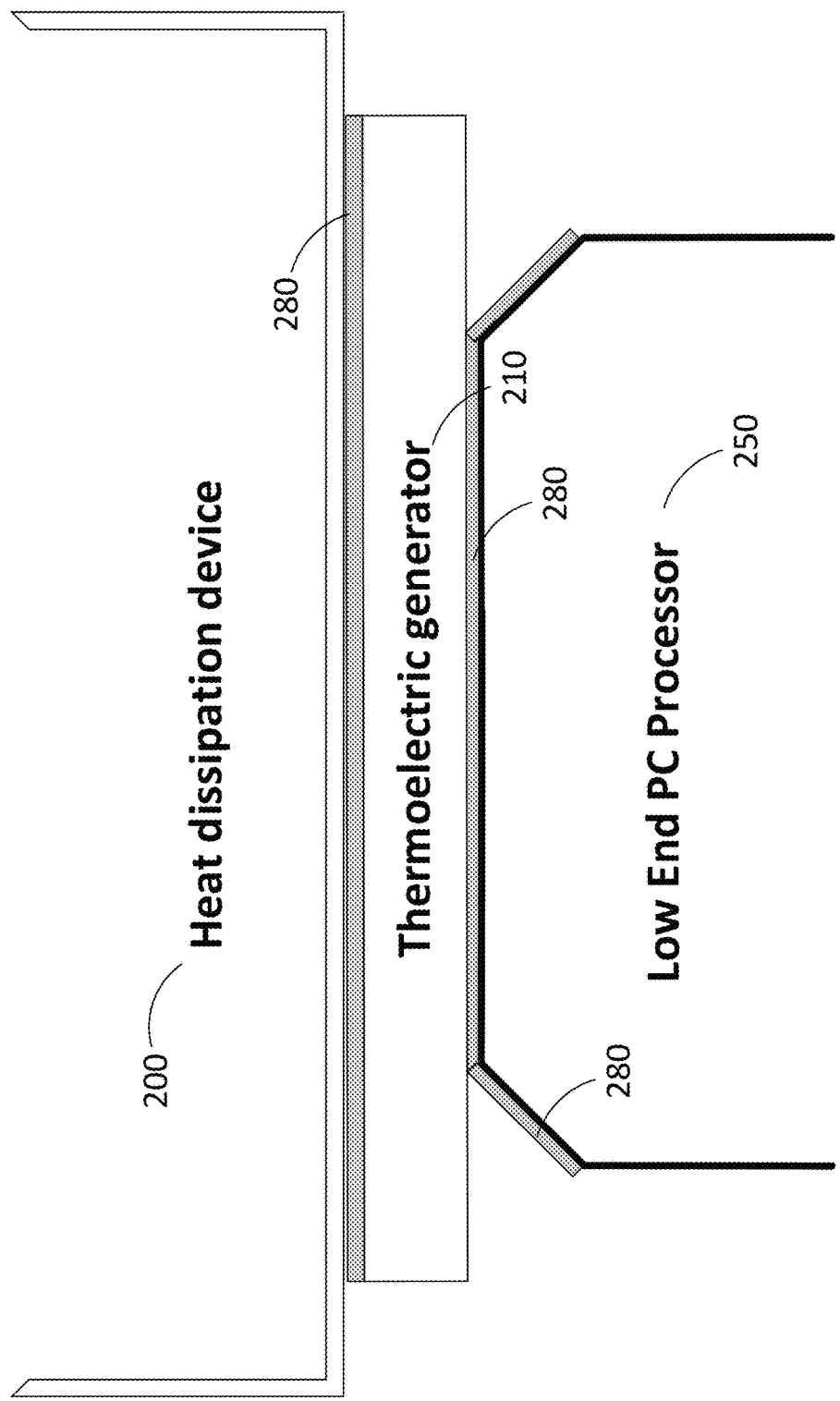
FIG. 3B is a schematic diagram showing a close-up view of the apparatus of FIG. 3A.

The embodiment illustrated in FIGS. 3A-3B addresses this issue. There is provided a heat dissipation device 200 which is used to enhance heat extraction from the cold side of the thermoelectric generator 210.

Indeed, the embodiment described above with reference to FIGS. 3A-4B uses the heat dissipation device 200 to keep the electronic component 250 working at a reasonable temperature. It improves the overall working of the system compared to the embodiment described in FIG. 1. This embodiment uses the heat dissipation device 200 to actively extract heat from the cold side of the thermoelectric generator 210, without being directly thermally connected with the electronic component as this is the case in the embodiments described further below and illustrated in FIGS. 4A to 7B.

In the present case, the cold side of the thermoelectric generator 210 is cooled down actively by the heat dissipation device 200, which is described below with reference to FIG. 2. This arrangement ensures that the exiting heat $Q_{out}$ is sufficient to avoid overheating. By actively pumping the heat ($Q_{out}$) from the system, the temperature on the cold side of the thermoelectric generator decreases, and a larger fraction of the heat entering the thermoelectric generator 210 can be transferred to electric energy. As a result, the amount of heat that is transferred from the electronic component 250 to the thermoelectric generator 210 ($Q_{W1}$) is enhanced, and is greater than in the embodiment of FIG. 1. This arrangement keeps the electronic component 250 at a lower temperature.

Figure 2:
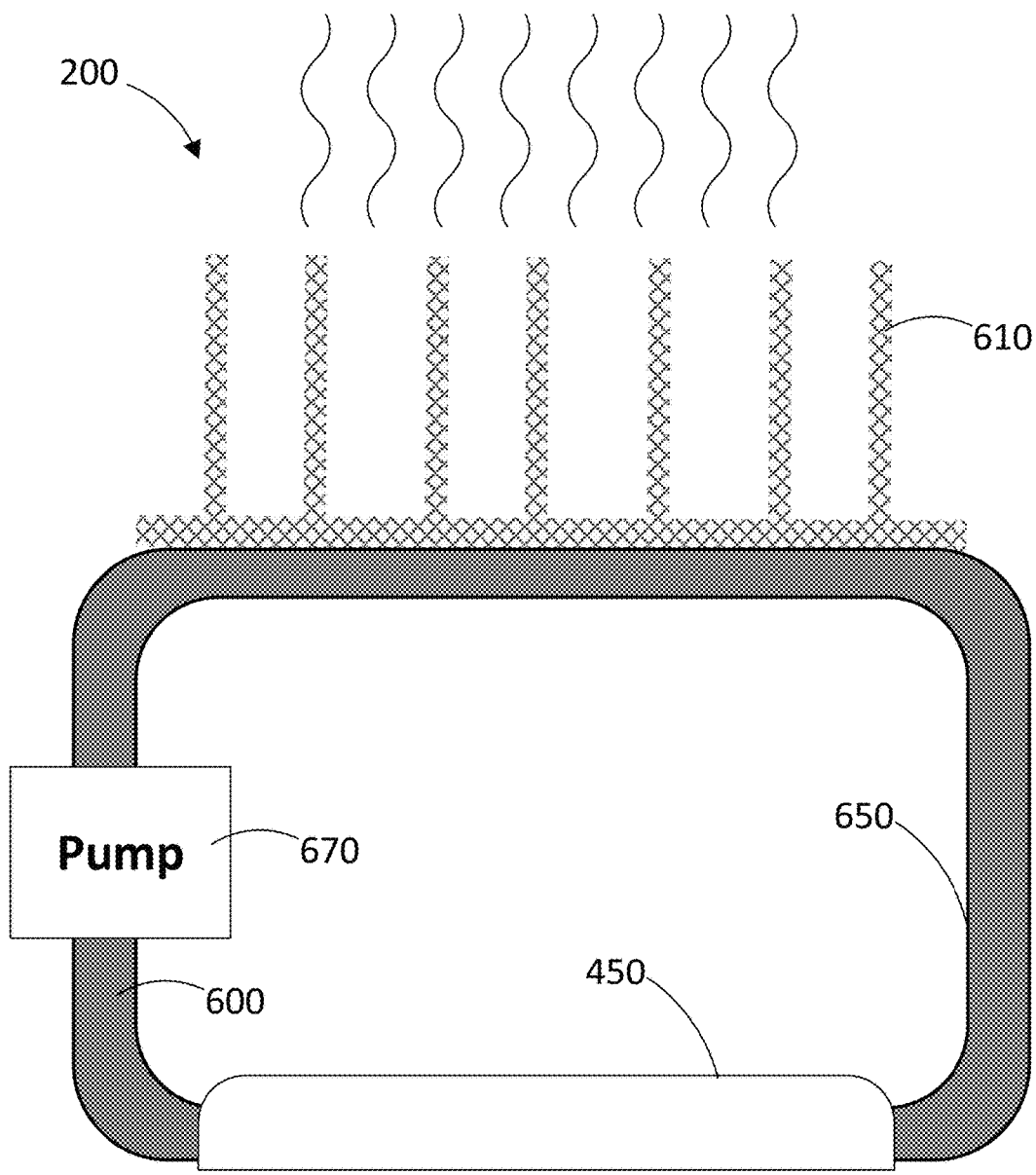
FIG. 2 is a schematic diagram illustrating a heat dissipation device 200 for accelerating overall heat extraction from the electronic component, according to an embodiment.

Now referring to FIG. 2, an embodiment of the heat dissipation device 200 is detailed. As shown in the embodiment illustrated in FIG. 2, an assembly comprising a pipe 650, a pump 670 and a heat sink 610 is provided to ensure sufficient heat dissipation to the environment. A heat exchange device 450 is provided to have the heat flow from the thermoelectric generator 210 to the fluid 600 in the pipe 650. According to this embodiment, the heat dissipation device 200 is a liquid-cooling heat sink.

According to an embodiment, there is one pipe 650 for transporting the heat transfer fluid 600 from the hot portion, close to the electronic component 250 and to the thermoelectric generator 210, to the heat sink 610 at which the heat is released and at which the heat transfer fluid 600 becomes cold again. There is another pipe 650 that brings that cold heat transfer fluid 600 toward the hot portion, where it can absorb heat once again.

According to an embodiment, the pipe 650 forms one quasi-circular pipe that is connected to both sides of the heat sink. According to another embodiment, the pipe 650 is a circular (closed) pipe, and the heat sink surrounds or contacts a portion of the pipe 650, as shown in FIG. 2. According to another embodiment, the pipe 650 comprises a plurality of smaller pipe portions that are connected one to the other to form a longer pipe.

A pump 670 is provided to have the heat transfer fluid 600 flow in the pipe 650. Various types of pumps can be used, as long as they generate a flow that is sufficient to ensure a proper heat transfer overall. Since the purpose of the apparatus is to recycle heat into electric energy, the pump 670 preferably involves low energy consumption. For example, the pipe 650 may be chosen to cause low resistance to the flow, e.g. by keeping the inside diameter (lumen) of the pipe relatively large and by avoiding any corners and steep turns in the pipe 650. As detailed below, the heat transfer fluid 600 may also be chosen with a consideration for the viscosity to keep flow resistance low.

According to an embodiment, the heat sink 610 comprises winglets or other equivalent thereof, basically a piece having a high surface/volume ratio and space for letting convection dissipate the heat from the heat sink. The material should be chosen so that thermal properties of the material allow heat to be dissipated in an effective manner, such as via convection, radiation, conduction, or a combination thereof. A fan can be added to enhance convection.

The heat transfer fluid 600 can be any suitable fluid known to perform this task adequately. Freon or glycol are typical examples of a heat transfer fluid and can be provided in a high variety of subtypes having particular properties. Many other fluids, either naturally occurring or artificially produced, can be used, as in other applications known in thermal engineering.

Preferably, the heat transfer fluid 600 has a low viscosity so that the pump 670 does not need too much energy to ensure fluid circulation in the pipe 650. Furthermore, the heat transfer fluid 600 preferably has a high heat capacity (also known as thermal capacity) for being able to absorb high amounts of energy. For example, ethylene glycol, often used in various thermal engineering applications for heat transfer, has a low viscosity and a high heat capacity. Other fluids have desirable properties and could be used. Other constraints may also dictate the choice of the fluid, such as safety considerations, cost or availability of the fluid, and the like.

According to the embodiment described above and illustrated in FIGS. 3A-3B, the heat dissipation device 200 is used alone to increase heat extraction from the heating source. It is preferably applied to low power electronic components (e.g. low-end PC processors).

For high power electronic components, it has been found that the apparatus can work properly if a fraction of the waste heat is directed away from the thermoelectric generator 210. Now referring to FIGS. 4A to 7B, a heat dissipation device 200 in combination with a heat transfer device 220 is used to direct waste heat away from both the thermoelectric generator 210 and the electronic component 250.

Therefore, the paragraphs below describe another embodiment in which a part of the waste heat $Q_W$ is directed away from the thermoelectric generator 210. This deviation (aka diversion) of waste heat is counterintuitive since it has the effect of subtracting useful heat from the thermoelectric generator 210. However, overall dissipation of waste heat is increased substantially, leading in a potentially smaller temperature difference and a lower electric power $\dot{Q}_E$, but also avoiding overheating of the electronic component 250, thereby resulting in a more functional apparatus. This embodiment of an apparatus can also work for more powerful electronic components, such as the computational and memory components of a server. This heat diversion or enhanced extraction is performed using a heat dissipation device 200 which will be detailed further below with reference to FIG. 2.

Figure 4B:
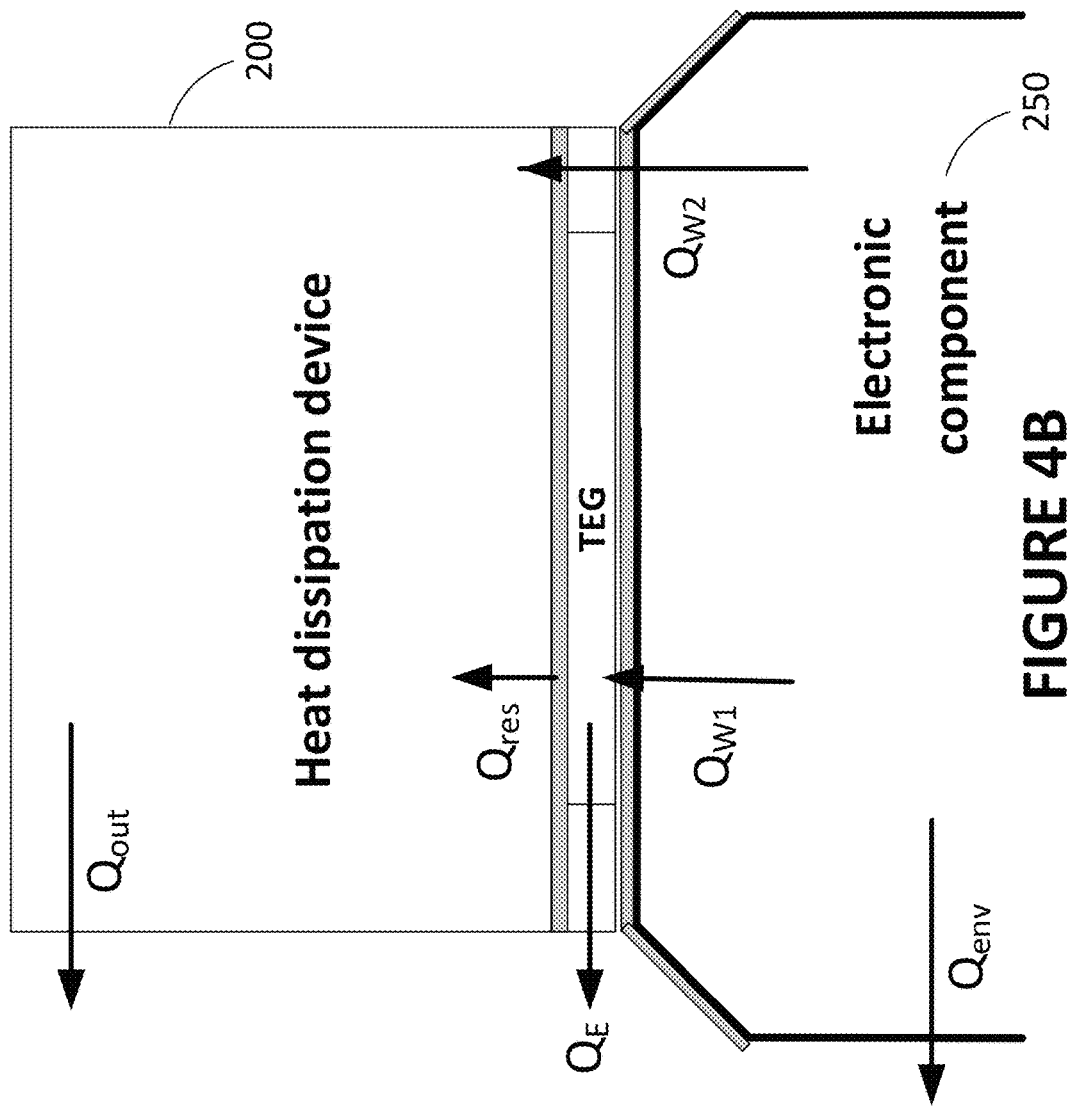
FIG. 4B is a schematic diagram illustrating the embodiment of the apparatus of FIG. 4A, with arrows indicating heat flows.

Now referring to FIGS. 4A and 4B, the waste heat $Q_W$ generated by the electronic component 250 is dissipated in the thermoelectric generator 210 ($Q_{W1}$), in the heat dissipation device 200 via the heat transfer device 220 ($Q_{W2}$) and in the environment ($Q_{env}$). Arrows indicating energy flows are shown in FIG. 4B.

From the heat entering the thermoelectric generator 210 ($Q_{W1}$), a fraction is transformed into electrical energy via the Seebeck effect ($Q_E$). The rest of the heat is residual heat ($Q_{res}$) that reaches the cold side of the thermoelectric generator 210 to be taken away by the heat dissipation device 200. Since the thermoelectric generator 210 is very thin compared to its surface area, heat dissipation to the environment can be neglected.

The electronic component 250 is also in thermal communication with the heat transfer device 220 that conducts heat ($Q_{W2}$) directly to the heat dissipation device 200.

Therefore, the heat dissipation device 200 receives an amount of heat from both the cold side of the thermoelectric generator 210 ($Q_{res}$) and from the electronic component 250 via the heat transfer device 220 ($Q_{W2}$).

Inside the heat dissipation device 200, this heat is transported by a heat transfer fluid 600 to a heat sink via a pipe 650, as detailed above. According to an embodiment, the pipe 650 is insulated to ensure that heat is radiated at the right place and is not dissipated among neighboring components. In this case, the energy received by the heat transfer fluid 600 is all radiated ($Q_{out}$) by the heat sink 610.

At steady state, the energy balance for these elements can be written as follow (the dot indicates a derivative with respect to time, $\dot{Q}$ is a power).

For the electronic component 250: $\dot{Q}_W = \dot{Q}_{W1} + \dot{Q}_{W2} + \dot{Q}_{env}$.
For the thermoelectric generator 210: $\dot{Q}_{W1} = \dot{Q}_E + \dot{Q}_{res}$.
For the heat dissipation device 200: $\dot{Q}_{W2} + \dot{Q}_{res} = \dot{Q}_{out}$.

When adding all the balance equations for the whole system:

$$\dot{Q}_W = \dot{Q}_E + \dot{Q}_{out} + \dot{Q}_{env}$$

Contrarily to the previous embodiment described above in which $\dot{Q}_{out}$ consisted only of residual heat from the thermoelectric generator 210, the embodiment presently described outputs a much higher $\dot{Q}_{out}$ because of the heat portion $\dot{Q}_{W2}$ that is transferred directly from the electronic component 250 to the heat dissipation device 200. Therefore, even though $\dot{Q}_W$ is very high for some powerful electronic components, the observed temperature rise is minimal because the overheating can be easily absorbed by the heat transfer fluid 600 of the heat dissipation device 200 and outputted at the heat sink 610 of the heat dissipation device 200, thanks to the bypass of generated heat via the heat transfer device 220. Because of this bypass of a portion of the waste energy, there is a reasonably high electric power $\dot{Q}_E$ outputted by the thermoelectric generator 210, while the temperature of the electronic component 250 remains reasonably low. This trade-off between the desired electrical output and the temperature of the electronic component 250 is attained by the deviation of the surplus of waste heat.

In the embodiment illustrated in FIG. 4A, the heat transfer device 220 connects parts of the apparatus. The heat transfer device 220 is the portion that ensures heat extraction from the electronic component 250 to the heat dissipation device 200. The heat transfer device 220 needs a high thermal conductivity, i.e. sufficiently high to direct enough heat away from both the electronic component 250 and the thermoelectric generator 210 to ensure that the electronic component 250 does not overheat.

Given that the heat transfer intermediate portion is also a link that connects parts together, it is usually a solid piece of material. Heat transfer occurs mainly as conduction and therefore the heat transfer device 220 is made of a thermally conducting material.

The conducting material is chosen to ensure a fast and substantial heat transfer. Materials with a high thermal conductivity are chosen, usually metallic materials.

Notably, copper has an excellent thermal conductivity of about 385 W/(m·K) at room temperature and can be used advantageously for that purpose.

Aluminum has a thermal conductivity lower than that of copper, at about 205 W/(m·K) at room temperature. This value is sufficient for a workable embodiment. Other metals, including alloys, are suitable if they exhibit sufficient thermal conductivity to be usable for that purpose. For example, silver and gold have thermal conductivities higher than that of copper, 406 W/(m·K) and 314 W/(m·K) respectively, which makes them suitable from a thermal point of view (however, their cost can be prohibitive). On the other hand, steel has a thermal conductivity of about 50 W/(m·K), which is not sufficient for the purpose contemplated for the heat transfer device 220. Stainless steel can even have a lower thermal conductivity, in the order of about 16 W/(m·K), which is further insufficient. Metallic materials with a thermal conductivity substantially lower than aluminum are not to be used.

Moreover, an increasing number of composite materials having a high thermal conductivity is available on the market, and could also replace pure or alloyed metallic materials for heat transfer between elements. However, these composite materials have usually metallic materials (such as copper) therein to provide the high thermal conductivity (>200 W/m·K). The other properties (i.e., mechanical properties) of composite materials may not be suitable.

Accordingly, the use of non-electrically-conducting materials with thermal conductivity in the range of 0.1 to 10 W/(m·K), as used taught in US2006/0086118A1, are not suitable for the purpose of the heat transfer device 220. These non-suitable materials include thermal greases, conductive compounds, conductive elastomers, conductive adhesive tapes, etc. Other slightly more thermally-conducting materials contemplated in existing documents, such as materials with thermal conductivities in the range of 1 to 20 W/(m·K), do not provide sufficient thermal conduction for the purpose of the heat transfer device 220. The same applies to semiconductors.

Considerations about the choice of a material for the heat transfer device 220 can be summarized as follows. The thermal conductivity needs to be at least as high as highly conductive materials, i.e., at least as high as the thermal conductivity of aluminum which is about 205 W/(m·K). For practical considerations, such as cost, ease of supplying, ease of machining or compatibility with other parts of the apparatus, etc., copper and aluminum are preferred over other materials. Therefore, according to an embodiment, the material for the heat transfer device 220 comprises copper. According to another embodiment, it comprises aluminum. According to another embodiment, it comprises another material chosen to have a thermal conductivity between 200 and 1000 W/(m·K), or chosen between 200 and 500 W/(m·K), or chosen between 200 and 400 W/(m·K). According to an embodiment, this chosen material is purely metallic (either a pure metal or an alloy with overall thermal conductivity in the suitable range).

However, materials with a thermal conductivity under 200 W/(m·K) are discouraged. Materials with a thermal conductivity under 100 W/(m·K), and more especially under 20 W/(m·K), are not to be used. According to an embodiment, the material for the heat transfer device 220 excludes any material with a lower thermal conductivity (e.g., under 20 W/(m·K), such as low thermal conducting metals like steel, semiconductors, thermal greases, conductive compounds, conductive elastomers, and conductive adhesive tapes). According to this embodiment, any of these materials shall not be included in the heat transfer device 220 as such. As described further below, there is already thermal paste 280 under and above the heat transfer device 220, so adding a similar material to form a part of the heat transfer device 220 would be useless and is discouraged. This requirement may be formalized as follows: the physical path from the electronic component 250 to heat dissipation device 200 includes as much metallic materials (copper, aluminum, or thermally similar materials) as possible, and as little thermal paste 280 as possible.

Heat extraction from the electronic component 250 directly to the heat dissipation device 200 is performed via the heat conductor or heat pipe 220. It can extract exceeding waste heat that the thermoelectric generator would otherwise be unable to extract, and inject it to the heat dissipation device 200 for evacuation or dissipation. There exist prior systems (e.g., US2006/0086118A1) in which the gap between the electronic component 250 and heat dissipation device 200 is completely filled with thermal paste or an equivalent thereof. The rate of heat diversion is not sufficient to provide the desired effect. This is why the heat transfer device 220 is added; the overall thermal resistance R of the path is the sum of the thermal resistances of the thin layers of thermal paste 280 and of the heat transfer device 220. It should be recalled that the thermal resistance R of a given path is proportional to its length L and inversely proportional to the thermal conductivity τ, and that the heat flow is inversely proportional to the total thermal resistance R. The overall effect of adding a material with a thermal conductivity above 200 W/(m·K) is thus to reduce the "effective thickness" of the path for the heat flow diversion, resulting in a proper rate for the heat diversion (much higher than with only thermal paste 280 filling the whole gap between the electronic component 250 and heat dissipation device 200).

When increasing the heat flow diversion rate $\dot{Q}_{W2}$ with a metallic material substantially filling the gap between the electronic component 250 and heat dissipation device 200, the contribution of the heat transfer device 220 is marginal. (Indices "tp" and "htd" refer to thermal paste and heat transfer device, respectively.)

$$\dot{Q}_{W2} = \frac{\Delta T}{R}, \quad R = \frac{L_{tp}}{\tau_{tp}} + \frac{L_{htd}}{\tau_{htd}}$$

It has been made clear that $\tau_{htd} \gg \tau_{tp}$, where the latter is normally under 20 W/(m·K). Therefore, the second term in the equation for R is small or even negligible compared to the first term depending on the exact values for $\tau_{htd}$ and $\tau_{tp}$. If the $\tau_{htd}$ is so large that the second term is completely negligible, the heat diversion rate $\dot{Q}_{W2}$ can be easily adjusted by arranging the right value for $L_{tp}$, i.e., the total thickness of thermal paste 280 on the path crossing the gap between the electronic component 250 and heat dissipation device 200. Obtaining a large $\tau_{htd}$ of this kind can be achieved by providing the heat transfer device 220 in the form of a heat pipe, as explained below.

The heat transfer device 220 of FIG. 4A can comprise, according to the embodiment, a heat conductor or heat pipe, as shown in FIGS. 5A-5B, 6A-6B, and 7A-7B. Alternatively, the heat transfer device 220 can be a part belonging to the heat exchange device 450 of the heat dissipation device 200 and extending therefrom (not shown).

The heat conductor or heat pipe is shown on the figures as a cross-section. It will be understood that they can fill a part of the volume surrounding the thermoelectric generator 210. By surrounding the thermoelectric generator 210 on the electronic component, a higher surface of contact is obtained both with the electronic component 250 and with the heat dissipation device 200. Other shapes are possible: a single metallic rod or tube, a plurality of them, a hollow cylinder around the thermoelectric generator 210, a hollow cylinder-like shape with a square or rectangular base, and the like. Having the heat transfer device 220 surround the thermoelectric generator 210 usually implies a partial surrounding since some space must be left for the electric wires connected to the thermoelectric generator 210. In other words, the thermoelectric generator is affixed on a part of a surface of the electronic component and defines a remainder of the surface of the electronic component. The heat transfer device is affixed on the remainder of the surface, thereby surrounding the thermoelectric generator at least partially. If both the thermoelectric generator 210 and the heat transfer device 220 have substantially the same thickness (usually between a fraction of a millimeter to a centimeter, approximately), the heat dissipation 200 (for example via its heat exchange device 450) can be affixed on the top surface of both of them.

If the element 220 is only a heat conductor, it should comprise the properties (nature of the material, thermal conductivity, etc.) described above.

Otherwise, the element 220 can be a heat pipe. A heat pipe is hollow (it has a chamber or lumen) and has an envelope made of a conductive material chosen with the same thermal conductivity requirements as for the heat conductor, as described above. To differentiate it from a simple heat conductor, the heat pipe comprises a working fluid in its chamber. The working fluid in usually water, although various coolants or ammonia can be used. The heat pipe takes advantage from the presence of a working fluid to extract heat more efficiently at the heat source by having the working fluid evaporate. The heat extracted from the heat source is transferred in the form of latent energy to the evaporated working fluid. This vapor is then actively or passively transported (either with a fan or pump, or under the action of gravity because of a lower density of vapor compared to the liquid density) toward the heat dissipation device where latent heat is transferred from the vapor to the heat dissipation device 200. The vapor then turns back to liquid and is returned to the heat source. The use of the latent heat of the working fluid strongly increases the rate of heat transfer. A heat pump is therefore preferred to the heat conductor if the rate of waste heat removal from the electronic component 250 needs to be very high compared to a heat conductor alone. The thermal conductivity of a heat pipe will always be as high as the heat conductor used to make the heat pipe, but the addition of convection to the overall heat transfer can propel the effective thermal conductivity to a very high level, up to 100 kW/(m·K) in optimal cases.

Figure 5B:
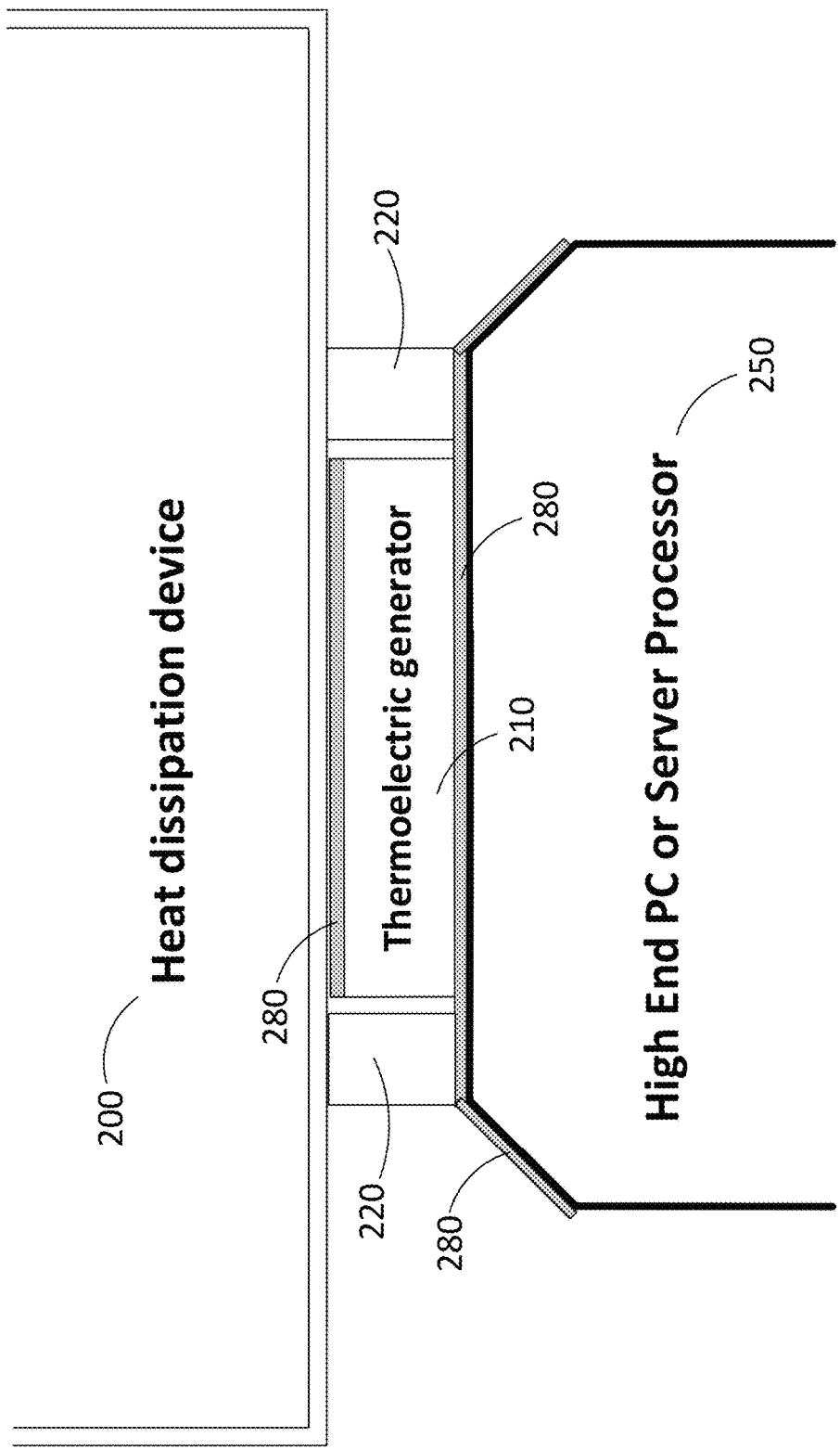
FIG. 5B is a schematic diagram showing a close-up view of the apparatus of FIG. 5A.
Figure 6A:
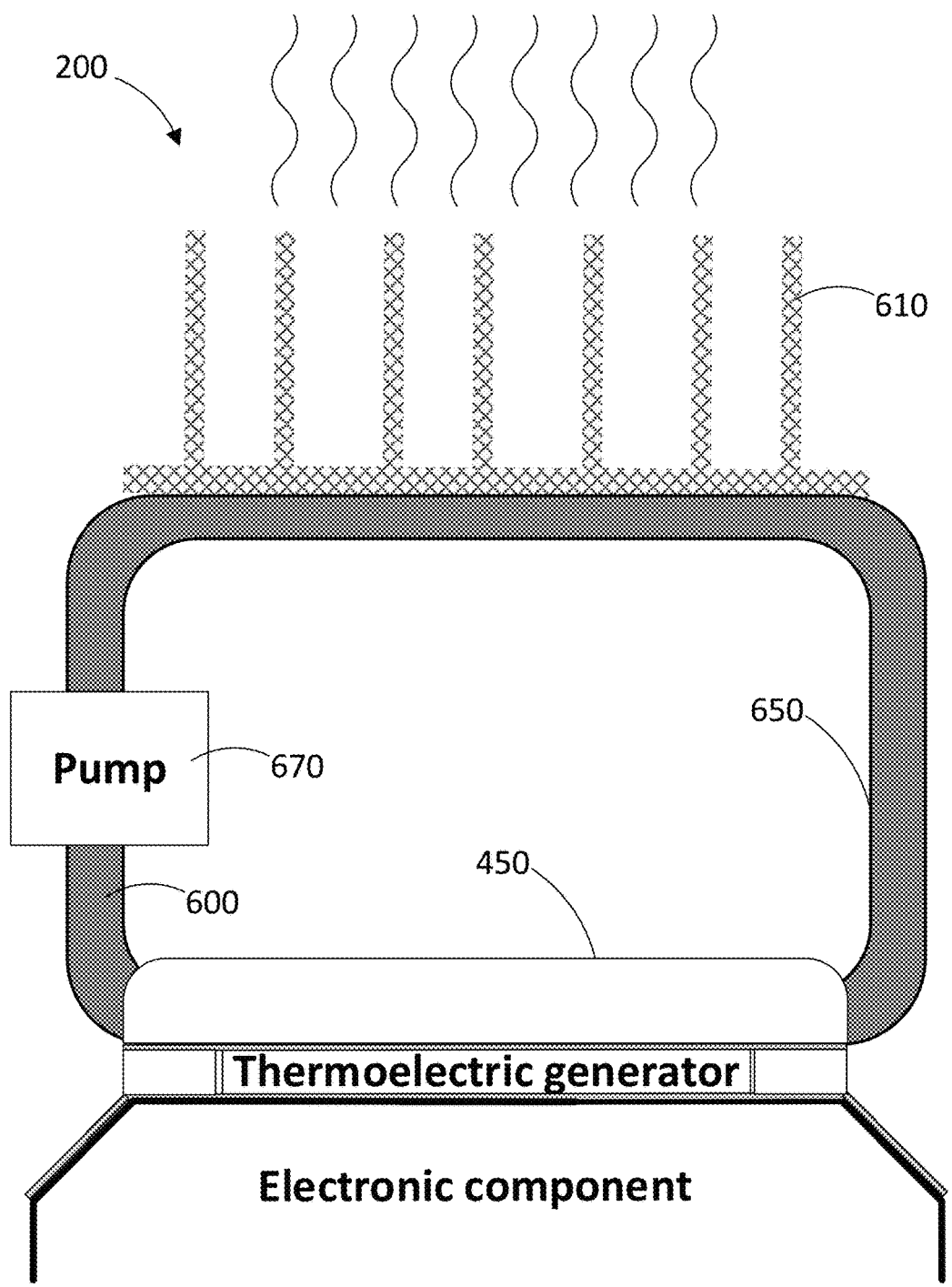
FIG. 6A is a schematic diagram illustrating the embodiment of the apparatus illustrated in FIGS. 6A and 6B, with the heat dissipation device 200 detailed as illustrated in FIG. 2.
Figure 6B:
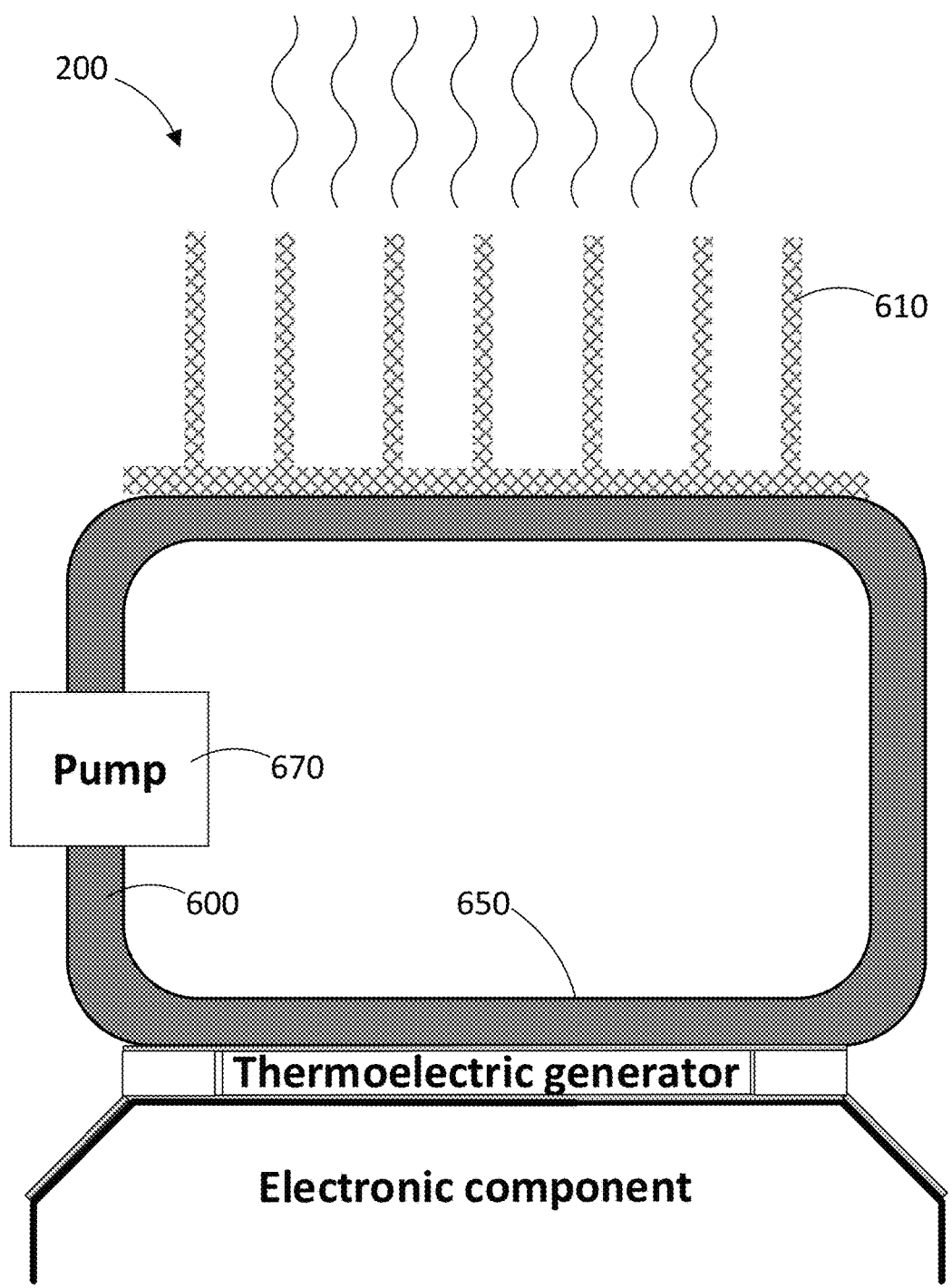
FIG. 6B is a schematic diagram illustrating the embodiment of FIG. 6B, without the heat exchange device.
Figure 7B:
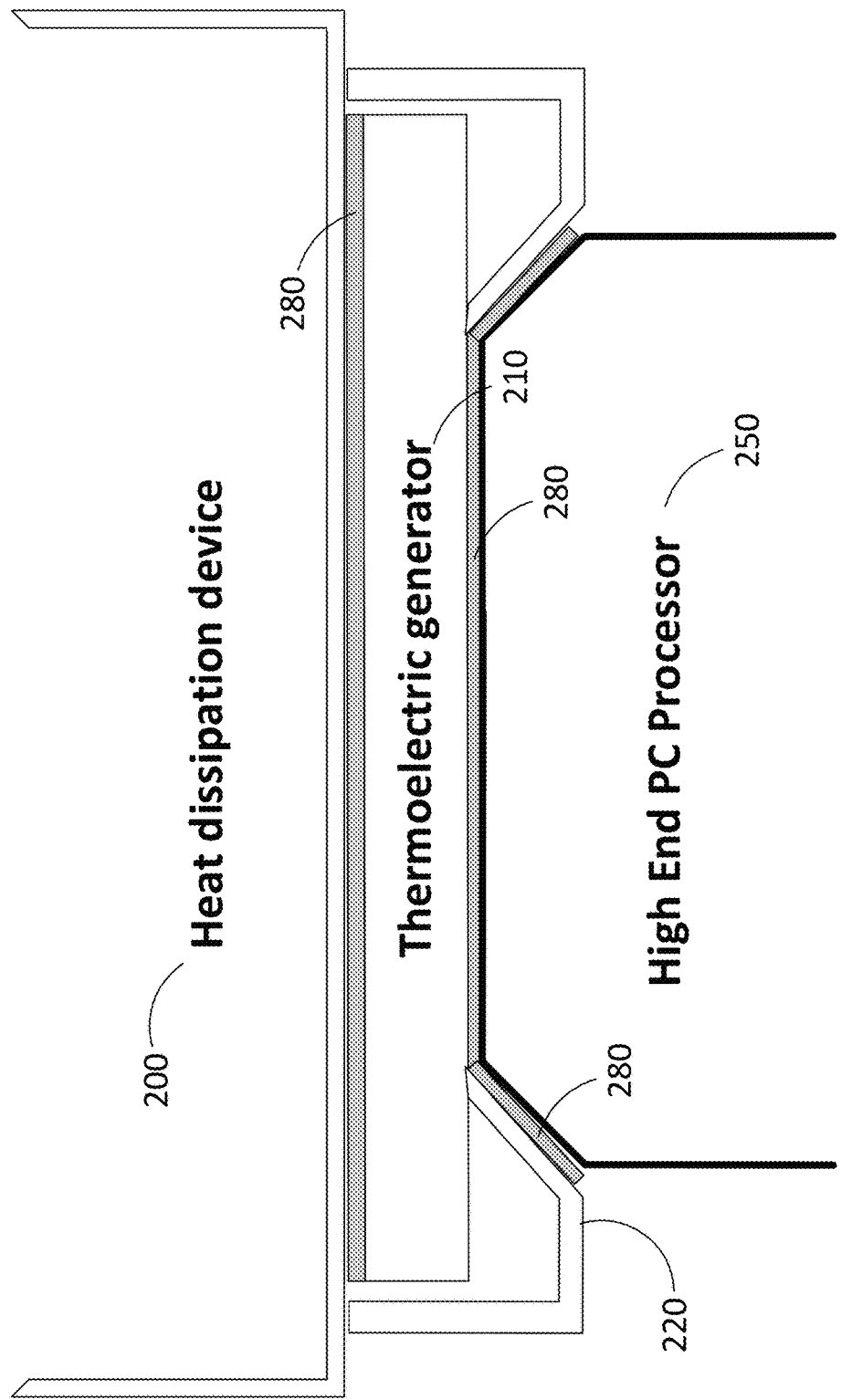
FIG. 7B is a schematic diagram showing a close-up view of the apparatus of FIG. 7A.

FIGS. 5A-5B, 6A-6B and 7A-7B illustrate different shapes that are possible for the heat conductor or heat pipe 220. FIGS. 7A-7B illustrate an embodiment in which a heat conductor or heat pipe 220 is adapted to contact the electronic component 250, when the thermoelectric generator 210 is larger than the electronic component 250. In this case, the heat conductor or heat pipe 220 has a L-shaped or V-shaped cross-section (and other variations) that connects the heat dissipation device to a side of the electronic component 250 (such as the inclined side shown in FIGS. 7A-7B) while staying away from or around the thermoelectric generator.

FIGS. 5A-5B illustrate an embodiment in which a heat conductor or heat pipe 220 is adapted to contact the electronic component 250, when the electronic component 250 is larger than the thermoelectric generator 210. In this case, the heat conductor or heat pipe 220 surrounds the thermoelectric generator 210 and has a rectangular cross-section, as shown (other variations are possible).

Furthermore, FIG. 6A shows the embodiment of FIGS. 5A-5B in which the heat dissipation device 200 is illustrated in detail as in FIG. 2. However, FIG. 6B differs in that there is no heat exchange device 450 forming the base of the heat dissipation device 200. In this case, the heat is transferred directly from the cold side of the thermoelectric generator 210 and from the heat transfer device 220 to the pipe 650 containing the fluid 600, with no intermediary (heat exchange device 450) as in FIG. 6A.

Now referring to general considerations, all embodiments described and illustrated comprise a thermoelectric generator 210. According to an embodiment, the thermoelectric generator 210 is a Peltier generator, also known as a Seebeck generator. A voltage is generated via the Seebeck effect, which is reciprocal to the Peltier effect. Under the Peltier effect, when a voltage is applied to a proper combination of conductive materials, a temperature difference is created between both sides of the device. Reciprocally, under the Seebeck effect, when a proper combination of conductive materials undergoes a temperature difference, a voltage is generated. The conductive materials are chosen so as to enhance the difference in their intrinsic Seebeck coefficient ($S_{ab}=S_a-S_b$) since the voltage is theoretically proportional to that difference.

A variety of those thermoelectric generators are available on the market. Some have built-in functions for generating a given current instead of a given voltage. Most comprise a plurality of thermoelectric modules that are arranged inside the thermoelectric generator. Thermoelectric generators can be provided in a variety of sizes. Some are designed to perform better under high or low temperature differences. Some are designed to be used preferably for the Seebeck effect, while others are designed to be used preferably for the Peltier effect.

In the present case, the thermoelectric generator 210 should be able to produce electric energy via the Seebeck effect, regardless of other capabilities and optimizations. Furthermore, various sizes of thermoelectric generators can be used. However, a size of the same order of magnitude as the size of the electronic component 250 being addressed is preferred. According to an embodiment, the size of the thermoelectric generator 210 is approximately the same as the exposed portion of the electronic component 250. According to another embodiment, the thermoelectric generator 210 comprises a plurality of small generators that can be stacked side-by-side to cover an appropriate surface of the electronic component 250 as if it was a unique thermoelectric generator. This may be useful if the electronic component 250 has a non-standard size for which there is no existing generator on the market with a similar size. For example, for a standard CPU of a server, there exist various thermoelectric generators on the market having a surface approximately the same as the CPU, which is very convenient because it requires only one generator and therefore minimal assembling.

The thermoelectric generator 210 generally has two sides which have a relatively large area compared to the area of the edges, which can be neglected since most thermoelectric generators are thin. The first side of the thermoelectric generator 210 is to be in thermal communication with the heat source (i.e., the electronic component 250). The first side can be defined as the "hot side" as its purpose is to receive heat, i.e., to be heated. The second side is to be in thermal communication with the environment, or with an element that will eventually bring heat to the environment. Since the purpose of the second side is to evacuate heat away from the thermoelectric generator 210, it is defined as the "cold side". It is usually the coldest part of the thermoelectric generator 210, and it is definitely colder that the "hot side" when the thermoelectric generator 210 is being used, otherwise the expected heat transfer could not occur. However, it does not mean that the "cold side" is cold from a human perspective.

Another general consideration is the nature of the mechanical and thermal contact between various elements of the apparatus. All illustrated embodiments show a thermal paste 280 (also known as thermal grease) used to connect pieces together while letting the heat flow freely there between, thanks to the high thermal conductivity of the thermal paste 280. Other connections are possible, such as soldering, metallic clamps or other connections allowing a good thermal conductivity while holding parts together. A different variety of adhesive known as thermal adhesive may also be used. The circumstances in which a thermal paste or a thermal adhesive can be used are usually known by a person skilled in the field of computer cooling.

Moreover, the contact with the electronic component may be performed directly or via a conductive plate such as a heat spreader, which is usually a conductive plate made of copper.

Furthermore, it should be noted that the apparatus can be manufactured in various levels of completeness. For example, the apparatus for waste heat recycling can be sold with the electronic component 250. It may also be sold without the electronic component but still with the thermoelectric generator already in place. In another case, it can be sold without the thermoelectric generator, i.e., comprising only the heat dissipation device 200 and the heat conductor or heat pipe 220. In this case, the apparatus can be defined as an apparatus for aiding in waste heat recovery since actual heat recovery will only be performed when associated with the thermoelectric generator 210.

Figure 8:
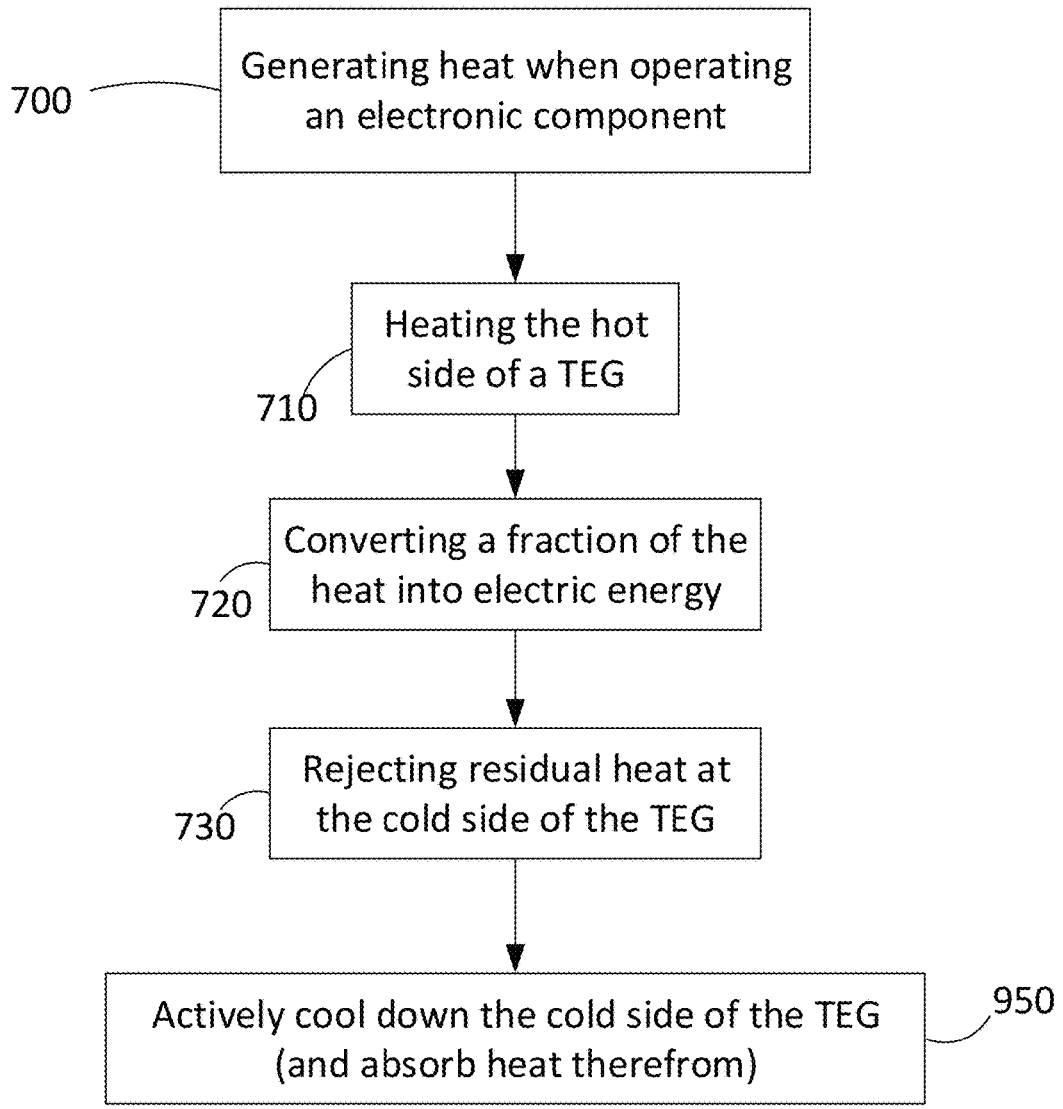
FIGS. 8-10 are flowcharts illustrating embodiments of a method for recovering heat from an electronic component.

FIG. 8 illustrates a method for recovering heat from an electronic component 250, according to an embodiment in which the electronic component 250 does not require heat to be directed away from the thermoelectric generator 210 to avoid overheating (low-power electronic component). The steps performed according to this embodiment are as follows.

Step 700: Generating heat with an electronic component 250. The heat is generally waste heat, or by-product heat, that is generated because the electronic elements of the electronic component 250 are performing their task; heat is lost via the Joule effect.

Step 710: Heating the hot side of a thermoelectric generator 210 with the heat generated at step 700. This step generally involves contacting the side of the thermoelectric generator 210 that is to be heated to a hot and conductive portion of the electronic component 250 (or to its heat spreader).

Step 720: Converting a fraction of the heat entering the thermoelectric generator 210 into electric energy. This is normally based on the Seebeck effect taking place in the thermoelectric generator 210. Intrinsically, this step further involves another step 730: rejecting residual (non-converted) heat at the other side of the thermoelectric generator 210, defined as the cold side because it is colder that the hot side.

Step 950: Actively cooling down the cold side of the thermoelectric generator 210 in order to absorb heat therefrom. This ensures a good heat transfer from the electronic component 250 to the thermoelectric generator 210 and then to the environment, keeping the electronic component 250 at a low temperature.

Figure 9:
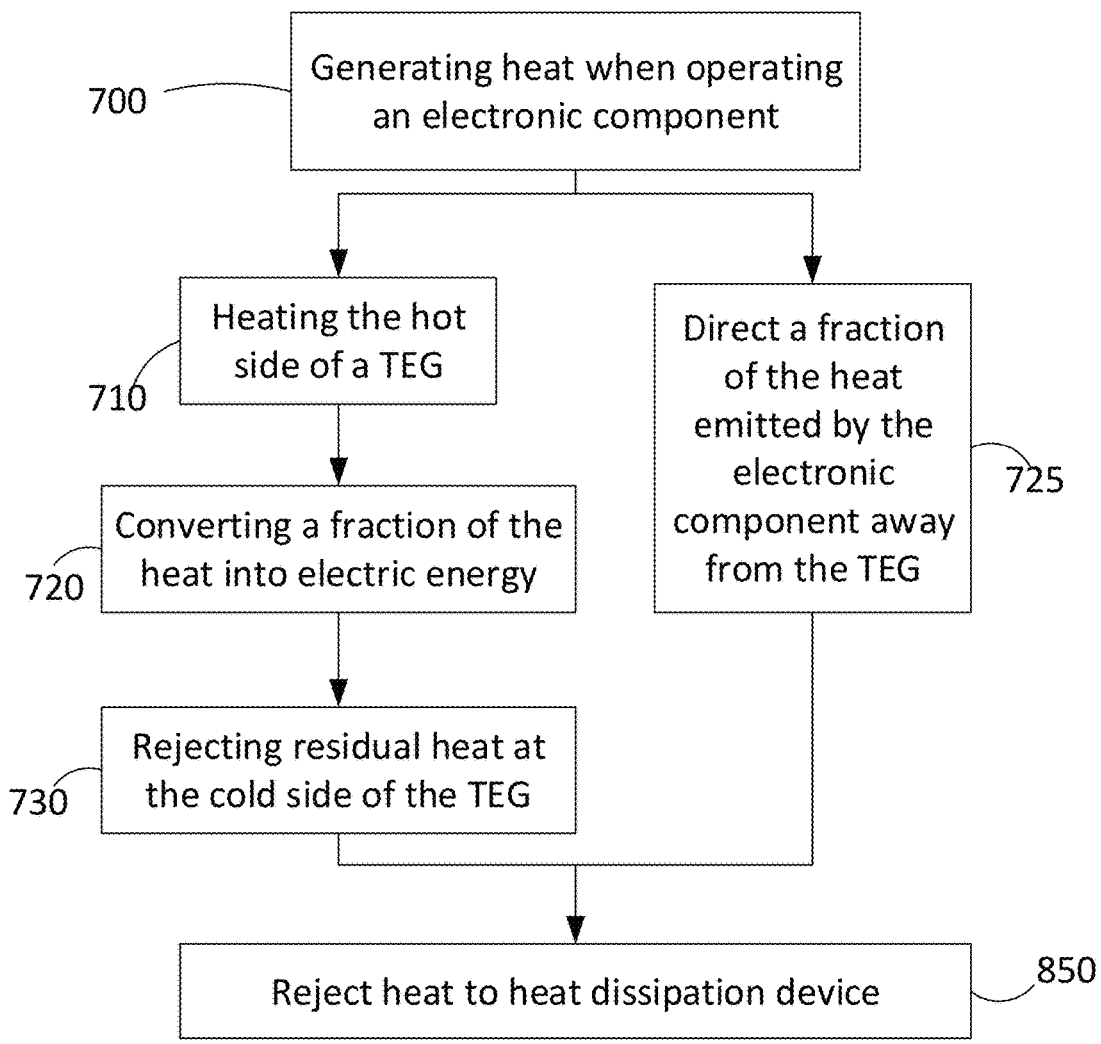

FIG. 9 illustrates a method for recovering heat from an electronic component 250, according to an embodiment in which the electronic component 250 needs heat to be directed away from the thermoelectric generator 210 to avoid overheating (high-power electronic component). The steps performed according to this embodiment are as follows.

Step 700: Generating heat with an electronic component 250. The heat is generally waste heat, or by-product heat, that is generated because the electronic elements of the electronic component 250 are performing their task; heat is lost via the Joule effect.

Step 710: Heating the hot side of a thermoelectric generator 210 with the heat generated at step 700. This step generally involves contacting the side of the thermoelectric generator 210 that is to be heated to a hot and conductive portion of the electronic component 250, or contacting the side of the thermoelectric generator 210 that is to be heated to a piece made of a conductive material (such as a heat spreader) which is itself in thermal communication with a hot and conductive portion of the electronic component 250.

Step 720: Converting a fraction of the heat entering the thermoelectric generator 210 into electric energy. This is normally based on the Seebeck effect taking place in the thermoelectric generator 210. Intrinsically, this step further involves another step 730: rejecting residual (non-converted) heat at the other side of the thermoelectric generator 210, defined as the cold side because it is colder that the hot side.

Step 725: Transferring the heat generated at step 700 to a heat transfer device 220 (simultaneously to step 710).

Step 850: Reject heat from the thermoelectric generator 210 and from the heat transfer device 220 to the heat dissipation device 200 for dissipation.

Figure 10:
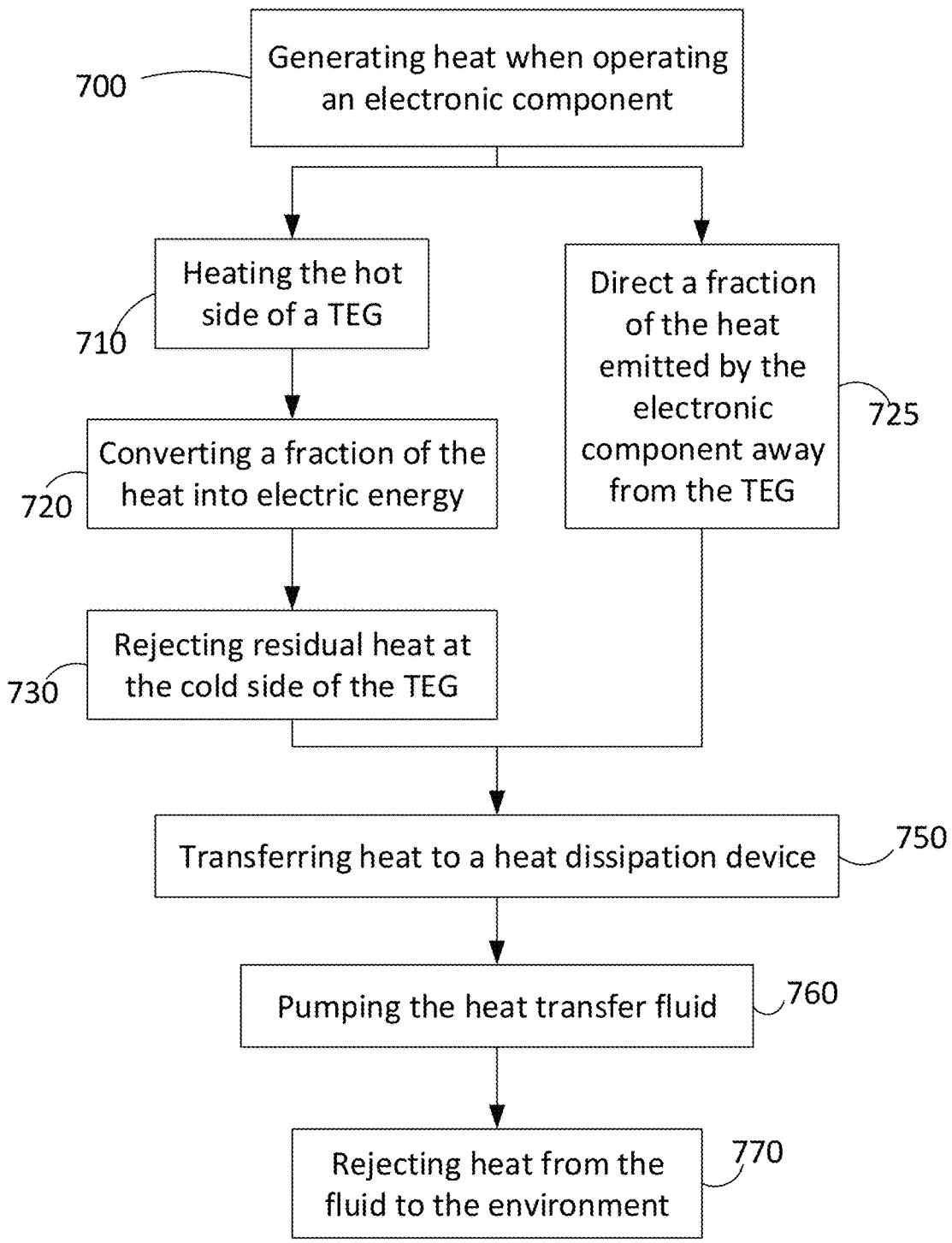

FIG. 10 details step 850 in various sub-steps with regard to the workings of the heat dissipation device 200 as shown in FIG. 2. More precisely, according to this embodiment, step 850 is detailed as follows:

Step 750: Reject heat to the heat exchanging device 450 of the heat dissipation device 200, thereby heating the fluid 600 for eventual dissipation.

Step 760: Upon heating the heat transfer fluid 600, pumping heat away from the heat source.

Step 770: Transferring the heat absorbed by the heat transfer fluid 600 outside of the system. This step usually involves bringing the fluid 600 in thermal communication with a heat sink that extracts heat from the fluid 600 and transmits it to the environment.

Step 780 (not shown): If the fluid 600 is in a closed loop, pumping the fluid 600 back to the heat source.

From the previous parts of the disclosure, it will be understood that the steps mentioned above (steps 700 to 780) can be performed in a continuous fashion.

The electric energy produced by the thermoelectric generator 210 can then be outputted through wires connected to the thermoelectric generator 210. This electric energy can be exported or used within the system, for example to drive the electronic component 250, the pump 670, fans, other electronic components, or a combination thereof.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. An apparatus for recovering heat from an electronic component to generate electric energy, the apparatus comprising:

a thermoelectric generator having a cold side and a hot side, the hot side in thermal communication with the electronic component;

a heat dissipation device in thermal communication with the cold side of the thermoelectric generator to dissipate heat it receives; and a heat transfer device consisting of metal with a thermal conductivity greater than 200 W/(m·K) for directly transferring the heat from the electronic component to the heat dissipation device and not in contact with the cold side of the thermoelectric generator; and a thermal interface material distinct from the heat transfer device and not comprising said metal, the thermal interface material connecting the thermoelectric generator to the electronic component to provide the thermal communication therebetween.

2. The apparatus of claim 1, wherein the metal comprises copper.

3. The apparatus of claim 1, wherein the metal comprises aluminum.

4. The apparatus of claim 1, wherein the thermal interface material comprises one of thermal paste and thermal adhesive between the electronic component and the thermoelectric generator, and between the electronic component and the heat transfer device, for enabling heat transfer therebetween.

5. The apparatus of claim 4, wherein the one of thermal paste and thermal adhesive has a thermal conductivity substantially smaller than the thermal conductivity of the metal of the heat transfer device, the one of thermal paste and thermal adhesive being substantially thinner than the heat transfer device for maintaining, during use, a heat transfer sufficient to avoid overheating of the electronic component.

6. The apparatus of claim 1, wherein the heat dissipation device comprises a liquid-cooling heat sink.

7. The apparatus of claim 1, wherein the heat transfer device comprises a heat pipe.

8. The apparatus of claim 7, wherein the heat pipe surrounds the thermoelectric generator at least partially.

9. The apparatus of claim 1, wherein the heat dissipation device comprises a heat transfer fluid for absorbing the heat from the thermoelectric generator and from the heat transfer device.

10. The apparatus of claim 9, wherein the heat dissipation device further comprises a pipe for having the heat transfer fluid circulate therein, for improving heat transfer to the heat dissipation device.

11. The apparatus of claim 10, wherein the heat dissipation device further comprises a heat sink in thermal communication with at least one of the pipe and the heat transfer fluid, for releasing heat from the heat transfer fluid.

12. The apparatus of claim 1, wherein the apparatus is for recovering heat from an electronic component comprising one of: a processor, a physical memory, and a chipset.

13. The apparatus of claim 1, wherein the hot side is in thermal communication with a heat spreader of the electronic component.

14. The apparatus of claim 1, wherein the thermoelectric generator is affixed on a part of a surface of the electronic component, defining a remainder of the surface of the electronic component, and wherein the heat transfer device is affixed on the remainder of the surface, thereby surrounding the thermoelectric generator at least partially.

15. The apparatus of claim 14, wherein the thermoelectric generator and the heat transfer device substantially have the same thickness, and wherein the heat dissipation device is affixed on both the thermoelectric generator and the heat transfer device.

16. The apparatus of claim 8, wherein the heat pipe extends outwardly from the electronic component to surround the thermoelectric generator without any contact with the cold side of the thermoelectric generator.

* * * * *